(12) United States Patent
Tandou et al.

(10) Patent No.: US 7,838,792 B2
(45) Date of Patent: Nov. 23, 2010

(54) PLASMA PROCESSING APPARATUS CAPABLE OF ADJUSTING TEMPERATURE OF SAMPLE STAND

(75) Inventors: Takumi Tandou, Asaka (JP); Ken'etsu Yokogawa, Tsurugashima (JP); Seiichiro Kanno, Kodaira (JP); Masaru Izawa, Hino (JP)

(73) Assignee: Hitachi High-Technologies Corporation, Tokyo (JP)

( * ) Notice: Subject to any disclaimer, the term of this patent is extended or adjusted under 35 U.S.C. 154(b) by 1118 days.

(21) Appl. No.: 11/512,118

(22) Filed: Aug. 30, 2006

(65) Prior Publication Data
US 2008/0023448 A1 Jan. 31, 2008

(30) Foreign Application Priority Data
Jul. 26, 2006 (JP) .............................. 2006-202716

(51) Int. Cl.
*B23K 9/02* (2006.01)
*H05H 1/24* (2006.01)

(52) U.S. Cl. ................... 219/121.36; 427/569

(58) Field of Classification Search ......... 219/121.36–121.43; 118/715, 723 VE, 724, 725; 165/104.19–104.34; 427/569–573; 438/729
See application file for complete search history.

(56) References Cited

U.S. PATENT DOCUMENTS
2005/0045104 A1* 3/2005 Arai et al. .................. 118/724
2007/0091537 A1* 4/2007 Buchberger et al. ......... 361/234

FOREIGN PATENT DOCUMENTS
JP          6-346256        12/1994
JP          2005-89864      4/2005

* cited by examiner

*Primary Examiner*—Sang Y Paik
(74) *Attorney, Agent, or Firm*—Antonelli, Terry, Stout & Kraus, LLP.

(57) ABSTRACT

A plasma processing apparatus is provided which processes a sample held on a sample table arranged in a process chamber in a vacuum container by using a plasma formed in the process chamber. The plasma processing apparatus comprises: paths arranged in the sample table in which a coolant is supplied and vaporized as it flows; a refrigeration cycle having the sample table, a compressor, a condenser and an expansion valve connected in that order and having the coolant circulate therein; coolant passages to cause the coolant that has passed through the expansion valve to branch and then merge with a coolant returning from the paths in the sample table toward the compressor; and a regulator to adjust an amount of coolant passing through the paths in the sample table and circulating in the refrigeration cycle and an amount of coolant branching and flowing through the coolant passages.

3 Claims, 7 Drawing Sheets

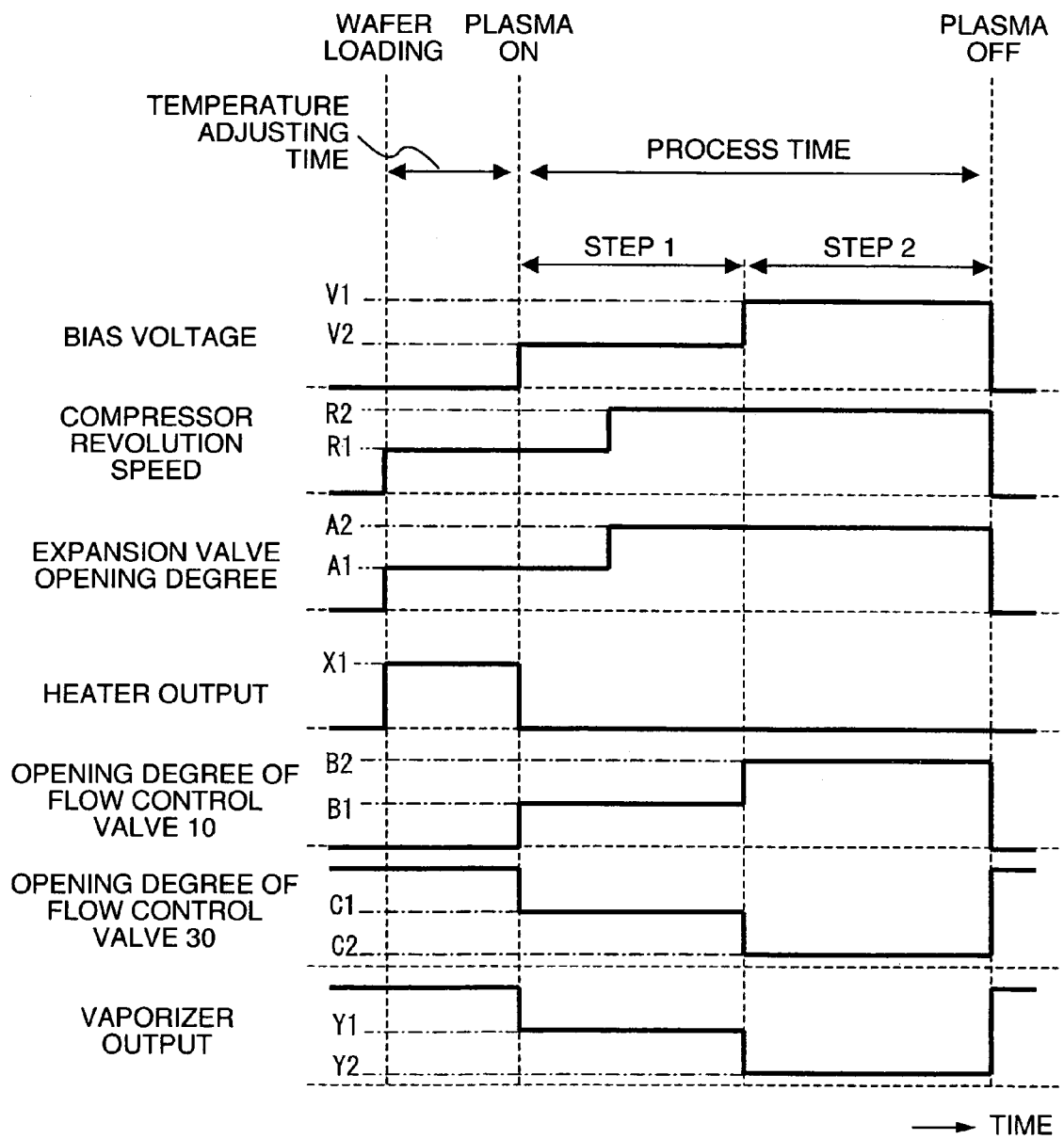

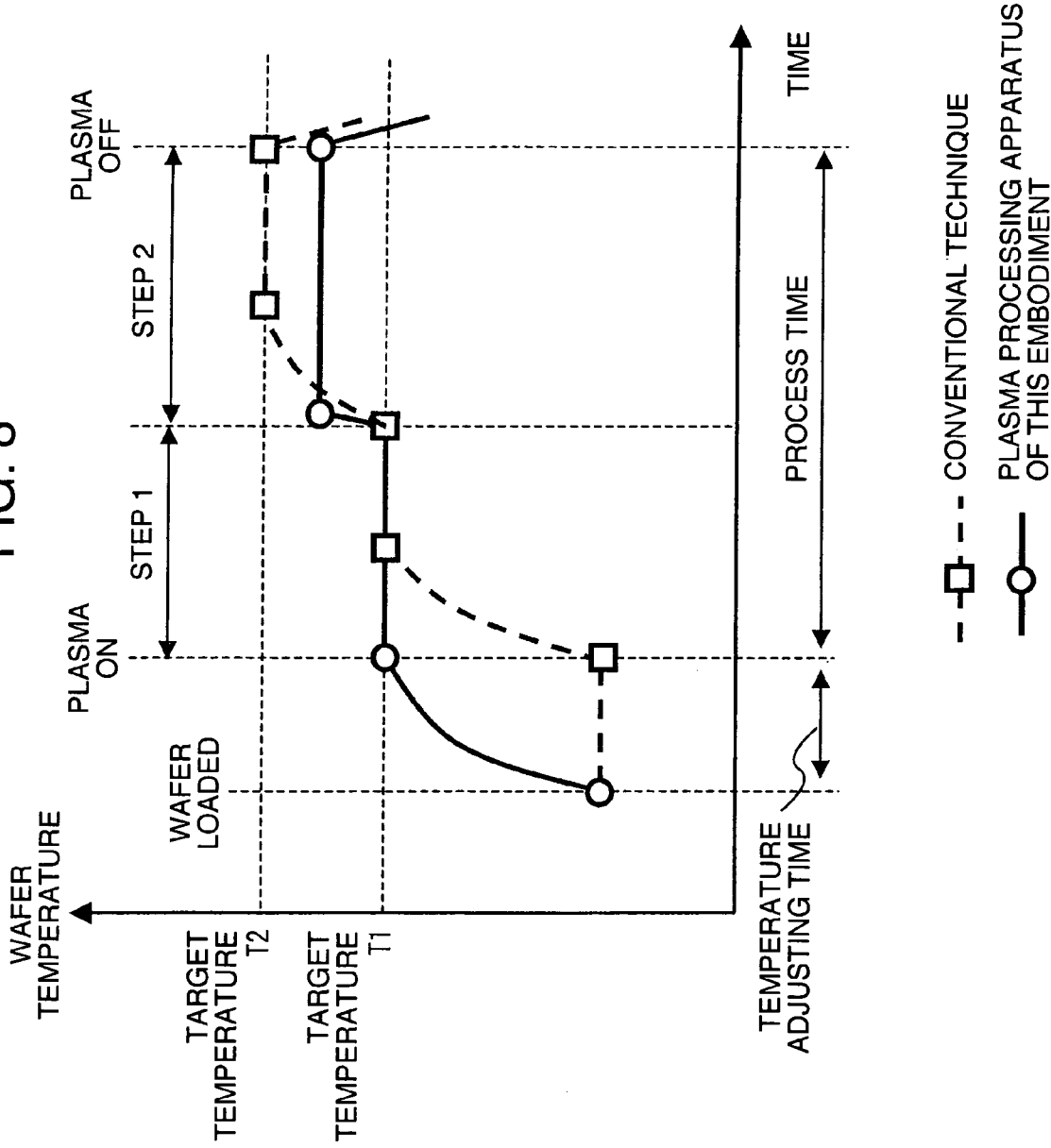

PLASMA PROCESSING APPARATUS CAPABLE OF ADJUSTING TEMPERATURE OF SAMPLE STAND

BACKGROUND OF THE INVENTION

The present invention relates to a plasma processing apparatus that processes a surface of a substrate-like sample, such as a semiconductor wafer, located or disposed in a vacuum container using plasma during a semiconductor device manufacturing process and more particularly to a plasma processing apparatus that performs processing by adjusting a temperature of a sample stand or sample table (or stage) used to hold the sample in a lower part of a process chamber in the vacuum container.

In such a plasma processing apparatus, in improving the accuracy of processing on the surface of the semiconductor wafer, the sample to be processed, it is important to suppress temperature variations of the surface of the wafer being processed and keep it uniform over the entire surface. Further, by properly adjusting the temperature of the wafer surface in each step of processing a plurality of films formed stacked one upon the other on the semiconductor wafer surface, the processing accuracy, selection ratio and throughput can be improved.

However, as semiconductor wafers increase in diameter and surface area in recent years, an electric power that the plasma processing apparatus applies to the semiconductor wafers during processing tends to increase. Particularly in a process of etching an insulating film, a large electric power on the order of kilowatt is applied in order to improve an etch rate. The application of such a large electric power results in an increase in an energy of impact with the semiconductor wafer produced by ions when attracted to the surface of the semiconductor wafer during the processing, which in turn increases the amount of heat the semiconductor wafer receives. Under these circumstances, there is a growing demand for a technology to adjust the temperature of the wafer stably, at high speed and with high precision.

In the plasma processing apparatus, it has been a conventional technique to adjust the temperature of a surface of a specimen holding stand that contacts a back of the specimen in order to control the surface temperature of the specimen, such as semiconductor wafer. That is, a technology has been adopted that adjusts the temperatures of the interior and surface of the sample table by a temperature adjusting means disposed inside the sample table.

The temperature adjusting method, for example, involves forming a coolant path in the specimen stand and flowing the coolant in the path to exchange heat between the coolant and the members inside the sample table and thereby keep the surface temperature of the sample table within a predetermined range. Such a coolant is circulated through a passage connecting a coolant supply device (for example, chiller unit) and the path inside the sample table and is adjusted to a predetermined temperature by a cooling device or heating device in the coolant supply device and supplied to the path in the sample table for heat exchange before being returned to the coolant supply device.

This coolant supply device is constructed to temporarily store the coolant in a tank in which the coolant is adjusted in temperature and then to supply the temperature-adjusted coolant to the sample table. With this technology, since the coolant has a large heat capacity compared with an increase or decrease in heat applied to the specimen, the surface temperature of the specimen can be kept constant effectively even when there are some variations in heat received by the specimen. On the other hand, since the temperature of the coolant greatly affects the temperature of the sample table and therefore the specimen, the variation in the coolant temperature has a large influence on the temperature change of the specimen. That is, a coolant with so large a heat capacity that its temperature change is small has difficulty coping with and adjusting rapid temperature changes of the specimen. Further, since its heat efficiency is low, the amount of coolant needs to be increased to cope with an increased quantity of heat received, making it necessary to increase the size of the coolant supply device, which in turn increases the manufacturing and installation cost of the plasma processing apparatus.

In contrast with such a conventional technology, a method for adjusting the temperature of the sample table using a so-called direct expansion type coolant supply device is being proposed. This type of coolant supply device has a coolant compressor, condenser and expander disposed in the passage in which the coolant circulates, in order to make the coolant circulation passage function as a refrigeration cycle so as to cool the sample table by evaporating the coolant in the path within the sample table so that the sample table can work as an evaporator in the refrigeration cycle. Known examples of such a technology are disclosed in JP-A-6-346256 and JP-A-2005-83864.

SUMMARY OF THE INVENTION

Both JP-A-6-346256 and JP-A-2005-89864 disclose coolant temperature adjusting methods that use a compressor and an expansion valve and which are advantageous in holding the coolant in a lower temperature range than 0° C. or keeping the temperature constant. However, since these conventional techniques make adjustment by combining the coolant pressure with the coolant flow rate, there is a problem that it is difficult to adjust the temperature and the thermal conductivity of the coolant independently of each other and that the adjustable temperature range of the sample is small. Further, to change the sample temperature requires increasing the revolution speed of the compressor to increase the amount of coolant being supplied or the coolant pressure. If the time it takes for the compressor revolution speed to rise, or so-called a rise time, is large, it is impossible to deal with a situation where the temperature needs to be changed to a desired value in a short duration of time, as when changing the temperature between different processing steps, increasing the time taken by the processing and degrading the efficiency.

An object of this invention is to provide a plasma processing apparatus capable of changing the temperature of the sample being processed at high speed and suppressing temperature variations.

Viewed from one aspect, the present invention provides a plasma processing apparatus to process a sample held on a sample table disposed in a process chamber inside a vacuum container by using a plasma produced in the process chamber, including: paths arranged in the sample table in which a coolant is supplied and vaporized as it flows; a refrigeration cycle having the sample table, a compressor, a condenser and an expansion valve connected in that order and having the coolant circulate therein; coolant passages to cause the coolant that has passed through the expansion valve to branch and then merge with a coolant returning from the paths in the sample table toward the compressor; and a regulator to adjust an amount of coolant passing through the paths in the sample table and circulating in the refrigeration cycle and an amount of coolant branching and flowing through the coolant passages.

Viewed from another aspect, the present invention provides a plasma processing apparatus to process a sample held on a sample table disposed in a process chamber inside a vacuum container by using a plasma produced in the process chamber, including: paths arranged in the sample table in which a coolant is supplied and vaporized as it flows; a first coolant passage running through a refrigeration cycle, the refrigeration cycle having the sample table, a compressor, a condenser and an expansion valve connected in that order; a second coolant passage to cause the coolant that has passed through the expansion valve to branch and then merge with a coolant returning from the paths in the sample table toward the compressor; and a regulator to adjust an amount of coolant passing through the first and second coolant passages after the branching.

In a further aspect of this invention, the regulator is disposed in the coolant passage between a point where the coolant branches and the sample table or in the coolant passage where the branched coolant has yet to merge; or the regulator is disposed in the first coolant passage between a point where the coolant branches and the sample table or in the second coolant passage where the branched coolant has yet to merge.

In a further aspect of this invention, before a temperature of the sample is raised during the processing of the sample, a temperature and a flow rate of the coolant flowing out of the expansion valve are adjusted beforehand to conform to a condition that matches the changed temperature of the sample; and, when the temperature of the sample is changed, the flow rate of the branched coolant is adjusted to supply the coolant that was adjusted beforehand to the sample table.

In a further aspect, the present invention provides a plasma processing apparatus to process a plurality of layers stacked one upon the other on a surface of a sample table by using a plasma produced in the process chamber, including: a vacuum container; the sample table disposed in a lower part of a process chamber inside the vacuum container; paths arranged in the sample table in which a coolant is supplied and vaporized as it flows; a refrigeration cycle having the sample table, a compressor, a condenser and an expansion valve connected in that order and having a passage running from the expansion valve toward the sample table and a passage running from the sample table toward the compressor; a bypass to cause the coolant to branch from the passage running toward the sample table, bypass the paths in the sample table and merge with a passage returning to the compressor; and a regulator to adjust an amount of coolant passing through the paths in the sample table and circulating in the refrigeration cycle and an amount of coolant branching and flowing through the coolant passages; wherein, during the processing of an upper layer of the plurality of layers, the compressor and the expansion valve are operated under a condition conforming to the lower layer to cause the coolant to flow into the bypass and at the same time supply the coolant adjusted by the regulator to the paths in the sample table.

In a further aspect of the invention, a coolant heating means is provided in a coolant passage from the coolant merging point to the compressor.

With this invention, a temperature adjusting unit for electrostatic chucking electrodes can be provided which can set the temperature of a semiconductor wafer during the etching processing at any desired value and which can also keep the temperature constant in each process step.

Other objects, features and advantages of the invention will become apparent from the following description of the embodiments of the invention taken in conjunction with the accompanying drawings.

BRIEF DESCRIPTION OF THE DRAWINGS

FIG. 7 is a time chart showing a flow of operations performed by the plasma processing device of FIG. 6.

FIG. 8 is a graph showing temperature changes in the sample that occur as the operation of FIG. 7 proceeds.

DESCRIPTION OF THE EMBODIMENTS

Now, embodiments of the present invention will be described by referring to the accompanying drawings.

Figure 1:
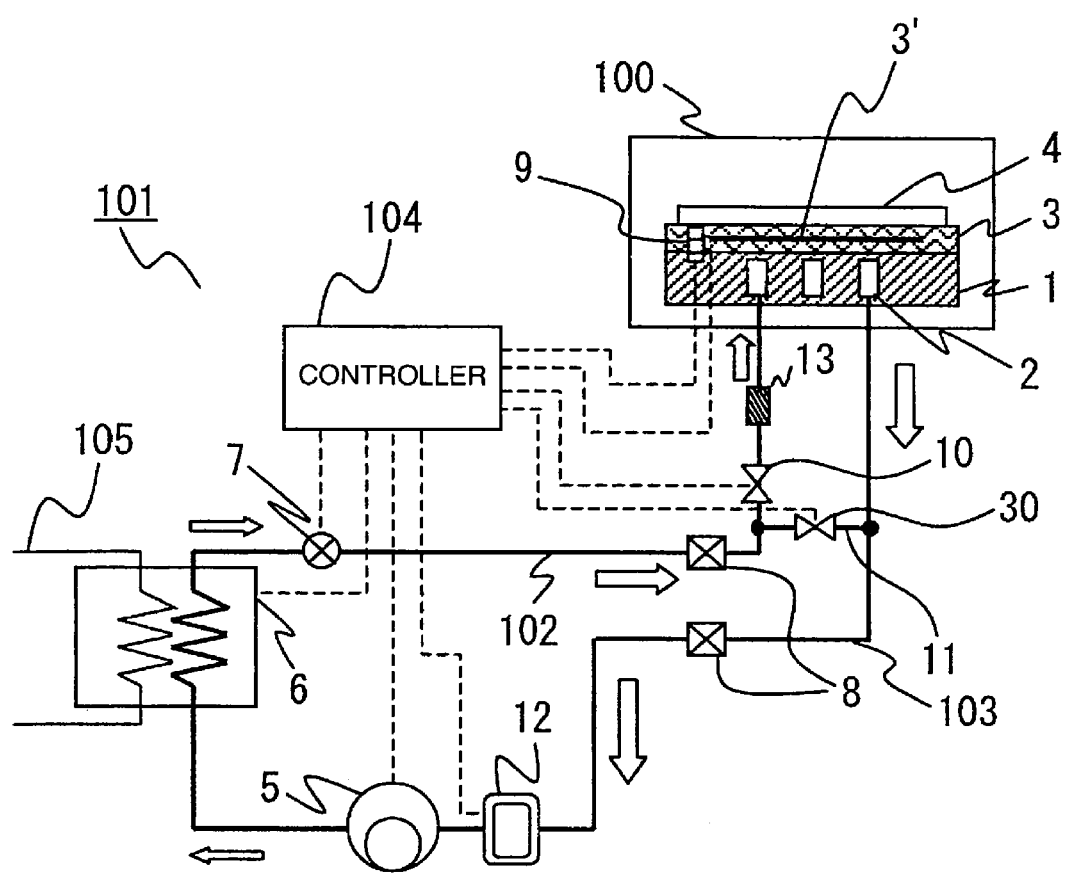
FIG. 1 is a schematic diagram showing an outline construction of a plasma processing apparatus as one embodiment of this invention.

The plasma processing apparatus according to a first embodiment of this invention will be described by referring to FIG. 1 through FIG. 8. FIG. 1 is a schematic diagram showing an outline construction of a plasma processing apparatus of the embodiment of this invention.

This embodiment, as shown in FIG. 1, comprises largely a process chamber 100 disposed in a vacuum container, a sample table 1 arranged in a lower part of the chamber, a refrigeration cycle 101 having the sample table 1 as its constitutional element and adapted to supply the sample table 1 with a coolant to adjust the temperature of the sample table 1, and a control device for controlling these. More specifically, in a base member of the sample table 1 made of a metal with high heat and electricity conductivity, there is formed a coolant path 2 through which the coolant flows. Arranged on the base member is a dielectric film 3 which has a heater 3' disposed therein and on which a semiconductor wafer sample is mounted and held by an electrostatic chucking. The upper surface of the dielectric film 3 forms a sample mounting surface on which to place a sample 4. Further, the sample table 1 including the coolant path 2, a compressor 5, a condenser 6 and an expansion valve 7 are connected by a passage, through which a coolant circulates, and combine to form the refrigeration cycle 101 that has the sample table 1 as an evaporator. Further, the condenser 6 exchanges heat with a cooling water supplied from a cooling water path 105 to cool the coolant.

The refrigeration cycle 101 is constructed to be separable from the process chamber 100 side, in this embodiment from the sample table 1, by means of connectors 8 on a coolant passage 102 from the compressor 5 toward the sample table 1 and on a coolant passage 103 from the sample table 1 toward the compressor 5.

Figure 2:
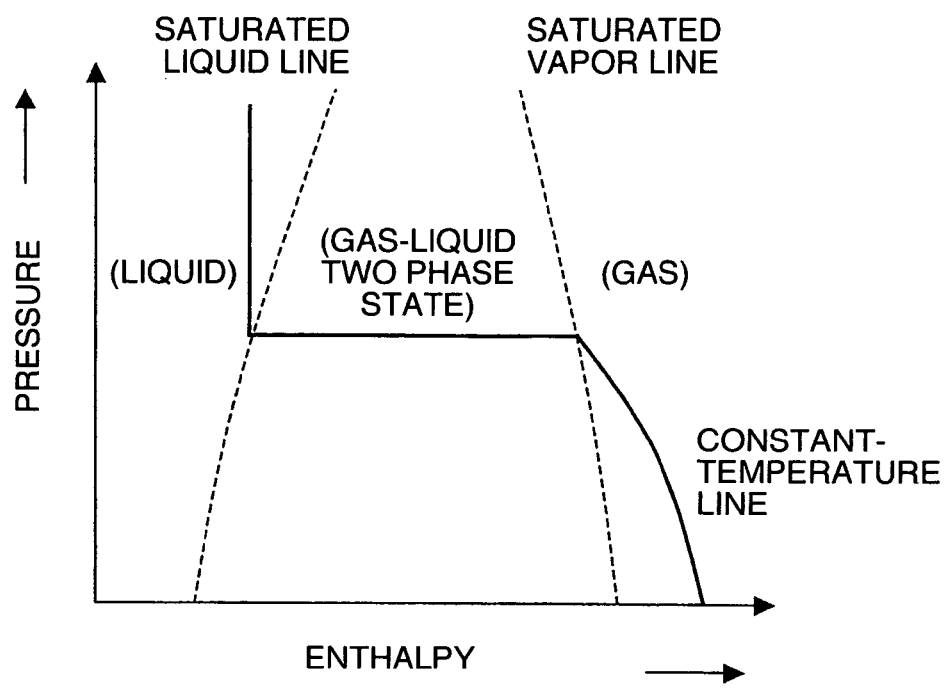
FIG. 2 is a graph showing characteristics of a coolant in a refrigeration cycle in the embodiment of FIG. 1.
Figure 3:
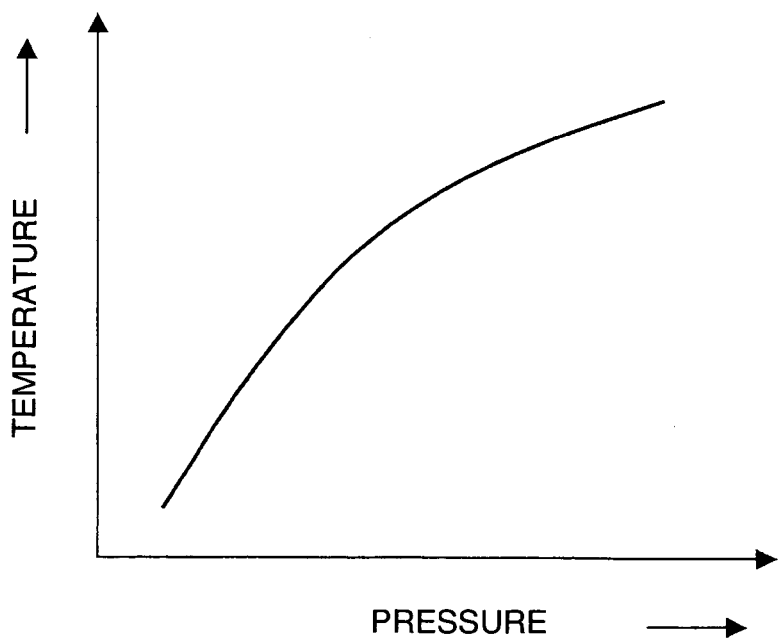
FIG. 3 is a graph showing characteristics of a coolant in the refrigeration cycle of this embodiment.

FIG. 2 and FIG. 3 are graphs showing characteristics of the coolant in the refrigeration cycle of this embodiment. This embodiment cools the sample table 1 in contact with the coolant by the latent heat (heat of vaporization) when the coolant evaporates in the coolant path 2 of the sample table 1. In the coolant path 2 where the heat exchange of the coolant (vaporization) is taking place, the coolant is in a gas-liquid phase state and, as shown in FIG. 2, the coolant temperature is theoretically constant as long as the pressure of the coolant remains constant. On the other hand, as shown in FIG. 3, the coolant temperature basically increases as the pressure increases. In this invention, therefore, the coolant pressure is adjusted to adjust its temperature and the flow rate of coolant is adjusted so that the coolant does not completely vaporize between the inlet and outlet of the coolant path 2 (the coolant does not completely turn into a gas state). As a result, the coolant in the sample table 1 is kept in the gas-liquid state and at a predetermined temperature, realizing a quicker heat exchange in a wider range of temperature by the evaporation of the coolant and improving temperature uniformity in the sample table 1. For example, when R-410 is used as a coolant in this embodiment, the temperature adjustment in a range of between −50° C. and +100° C. is possible.

JP-A-6-346256 and JP-A-2005-89864 both represent coolant temperature adjusting methods using a compressor and an expansion valve and which are advantageous in holding the coolant in a lower temperature range than 0° C. or keeping the temperature constant. However, since these conventional techniques make adjustment by combining the coolant pressure with the coolant flow rate, there is a problem that it is difficult to adjust the temperature and the thermal conductivity of the coolant independently and that the adjustable temperature range of the sample is small. Further, to change the sample temperature requires increasing the revolution speed of the compressor to increase the amount of coolant being supplied or the coolant pressure. If the time it takes for the compressor revolution speed to rise, or so-called a rise time, is large, it is impossible to deal with a situation where the temperature needs to be changed to a desired value in a short duration of time, as when changing the temperature between different processing steps, increasing the time taken by the processing and degrading the efficiency.

For example, in the case of a compressor with an output of 1000 W (used in a 4 kW-class refrigeration cycle), the revolution speed of the compressor changes less than 2% per second of its maximum output and is considered to take more than 50 seconds to reach the maximum output.

As for a coolant bypass with a certain conductance in JP-A-2005-89864, when the flow rate of coolant in the normal refrigeration cycle becomes excessive and the pressure in the passage rises, the coolant bypass can accommodate an overflowing coolant to prevent overcooling. Despite this advantage, the coolant bypass gives rise to a problem that the time it takes for the sample table 1 to change to a desired temperature becomes longer or that the range in which the temperature of the sample table 1 can be changed in a short length of time is narrowed, reducing the realizable temperature range of the sample table 1. Further, in a case where a valve is disposed in each coolant path to control the coolant flow rate in the path, when the coolant flows through the coolant bypass, there is a possibility that the compressor may be broken by an insufficient evaporation of the coolant or an output of the refrigeration cycle may fall.

To deal with these problems, as shown in FIG. 1, this invention provides a coolant bypass 11 for connecting a coolant passage 102 running from the compressor 5 toward the sample table 1 and a coolant passage 103 running from the sample table 1 toward the compressor 5, with flow control valves 10, 30 disposed in the coolant passage 102 and the coolant bypass 11. The connecting portions between the coolant bypass 11 and the coolant passages 102, 103 are located between the coolant outlet of the expansion valve 7 and the inlet of coolant path 2 in the sample table 1 and between the outlet of the coolant path 2 and the coolant inlet of the compressor 5.

In this configuration, the coolant supplied from the compressor 5 flows through the expansion valve 7, after which it branches into two flows, with one flow of coolant passing through the sample table 1 and the other passing through the coolant bypass 11 before they merge together and return to the compressor 5. The flow control valves 10, 30 regulate the amount of coolant that flows through the evaporator for heat exchange and the amount of coolant that does not pass through the evaporator.

Further, this embodiment has the flow control valves 10, 30, the valves for adjusting the flow per unit time of coolant, disposed between the connecting portion of the coolant bypass 11 and the coolant passage 102 and the inlet of the coolant path 2 of the sample table 1 and on the coolant bypass 11. Also between the connecting portion of the coolant passage 103 and the coolant bypass 11 and the coolant inlet of the compressor 5, a vaporizer 12 to vaporize the coolant by heating is disposed. The above connectors 8 are disposed between the connecting portion of the coolant bypass 11 and the coolant passage 102 and the expansion valve 7 and between the connecting portion of the coolant bypass 11 and the coolant passage 103 and the vaporizer 12. These are all situated outside the vacuum container including the process chamber 100. A temperature sensor 9 disposed in the heater 3' and the dielectric film 3 to detect their temperatures, the flow control valves 10, 30, and those constitutional elements of the refrigeration cycle 101—the compressor 5, condenser 6 and expansion valve 7—are connected through communication means to a controller 104 including a processor so that the operations of these devices are controlled according to operation commands and signals communicated among them. To adjust the temperature of the sample 4 or sample table 1 to a desired value by a feedforward or feedback control described later, the controller 104 issues operation command signals to these devices based on an output from the temperature sensor 9, data stored in a memory device not shown and arranged to be able to communicate with the controller and a calculated result produced by the processor.

In this construction of this embodiment, the controller 104, which forms the plasma processing apparatus of this embodiment, retrieves conditions for particular processing, for example, on one layer on the sample to be processed from the memory device prior to an execution of the processing and, based on the retrieved conditions, issues commands for adjusting the output of the compressor 5 and the opening degree of the expansion valve 7 to predetermined values to the compressor 5 and the expansion valve 7 before the start of the processing. Based on these commands the revolution speed of the compressor 5 and the opening degree of the expansion valve 7 are increased or decreased to adjust the temperature (or pressure) and flow rate of the coolant supplied from the compressor 5 into the coolant passage 102 toward the coolant path 2 in the sample table 1. The flow rate of coolant that is adjusted and set at this time is used to determine a maximum flow rate of coolant supplied to the coolant path 2 during the associated processing.

The coolant that was adjusted in temperature and flow rate as described above flows through the coolant passage 102 and, at the connecting portion with the coolant bypass 11, branches in two directions, one toward the sample table 1 and another through the coolant bypass 11 toward the connecting portion between the coolant bypass 11 and the coolant passage 103. The flow rates of coolant flowing into the two branches at the connecting portion with the coolant bypass 11 are adjusted by the operation of the flow control valves 10, 30 according to the command signals from the controller 104.

Then, at the start of the processing, the coolant of the preset temperature and flow rate is supplied to the sample table 1. During this processing, according to an output signal representing a change in the amount of heat applied to the sample 4 and which is received from a detection means disposed in the process chamber 100, such as temperature sensor 9, the controller 104 controls the heating of the heater 3' or the flow rate adjustment operation of the flow control valves 10, 30.

In this embodiment, three-way valves are used for the flow control valves 10, 30 that that regulate the flow rate of the coolant flowing through the coolant passage 102 or the coolant bypass 11 so as to allow for a flow rate change of more than 10% per second of the maximum flow rate of coolant. By using the three-way valves (or a plurality of flow control valves), the flow rate in the coolant passage 102 can be controlled in a range of between 0% and 100%. If, on the other hand, the flow control valve 10 or 30 is disposed in only the coolant passage 102 or coolant bypass 11 (e.g., in the coolant passage 102), and if it is assumed that the coolant paths have equal conductance, the flow rate into the coolant passage 102 is in a control range of 0-50%. Further, if one wishes to switch the coolant flow instantaneously between the coolant passage 102 and the coolant bypass 11, a solenoid valve may be used for the flow control valve 10 or 30.

It is preferred that the flow control valves 10, 30 be disposed as close to the sample table 1 as possible to enhance a responsiveness of the coolant flow rate in the coolant path 2. Further, a means to adjust the flow rate may be added at the outlet side of the coolant path 2 and the flow rate from the outlet of the coolant path 2 is controlled to be reduced in order to increase the pressure (temperature) of the coolant in the path 2. With this construction for controlling the flow rate of coolant, the rise time of the compressor 5 can be reduced to improve the accuracy and responsiveness of the temperature adjustment of the sample 4.

Further, in this embodiment, a vaporizer 12 is disposed in the coolant passage 103 between the coolant inlet of the compressor 5 and the connector 8. This vaporizer 12 vaporizes the coolant, that has flowed through the coolant passage 102, coolant bypass 11 and coolant passage 103 and which is insufficiently vaporized, before it flows into the compressor 5. This prevents a possible damage to the compressor 5 by the coolant of liquid state and an output reduction of the refrigeration cycle. An example of the vaporizer 12 includes a suction tank with a heater. This embodiment also has disposed at the front of the inlet of the coolant path 2 a tank 13 with a filter function to remove water and foreign matters from the coolant in the coolant passage 102. The coolant is temporarily stored in the tank 13 and a part of the coolant in the tank 13 is supplied to the coolant path 2 of the sample table 1. With this construction, an electric corrosion by high frequency power supplied to the sample table 1 can be prevented.

The temperature sensor 9 directly or indirectly detects the temperature of the back of the sample 4 or the temperature of the interior of the sample table 1 (dielectric film 3) near the sample 4. As the temperature sensor 9, a thermocouple, a fluorescent thermometer or a radiation thermometer may be used. In this embodiment, the heater 3' incorporated in the sample table 1 is preferably one having a small heat capacity, considering the temperature controllability. For example, arranging a thin film tungsten heater (with an output of 100 W or higher) in the dielectric film 3 can raise the surface temperature of the dielectric film 3, on which a sample is put, at a rate of more than 1° C./sec. Further, a sheath heater may be built into the surface of the base member of the sample table 1 for heating.

An example procedure for adjusting the output of the heater 3', as performed by the controller 104, involves adjusting the heater to a temperature slightly lower than (within −5° C. of) a target temperature of the sample table 1 that is to be used in the sample temperature adjusting operation and, at the start of the processing, heating the sample table 1 by the heater 3' to near the target temperature (within ±1° C.). This realizes a quick and precise adjustment of temperature of the sample 4. The heat application unit shown in JP-A-2005-83864 adjusts the degree of coolant dryness rather than the temperature of the coolant because of the characteristic of the coolant. It is therefore difficult to adjust the temperature on the heating side of the electrostatic chucking electrode.

Figure 4:
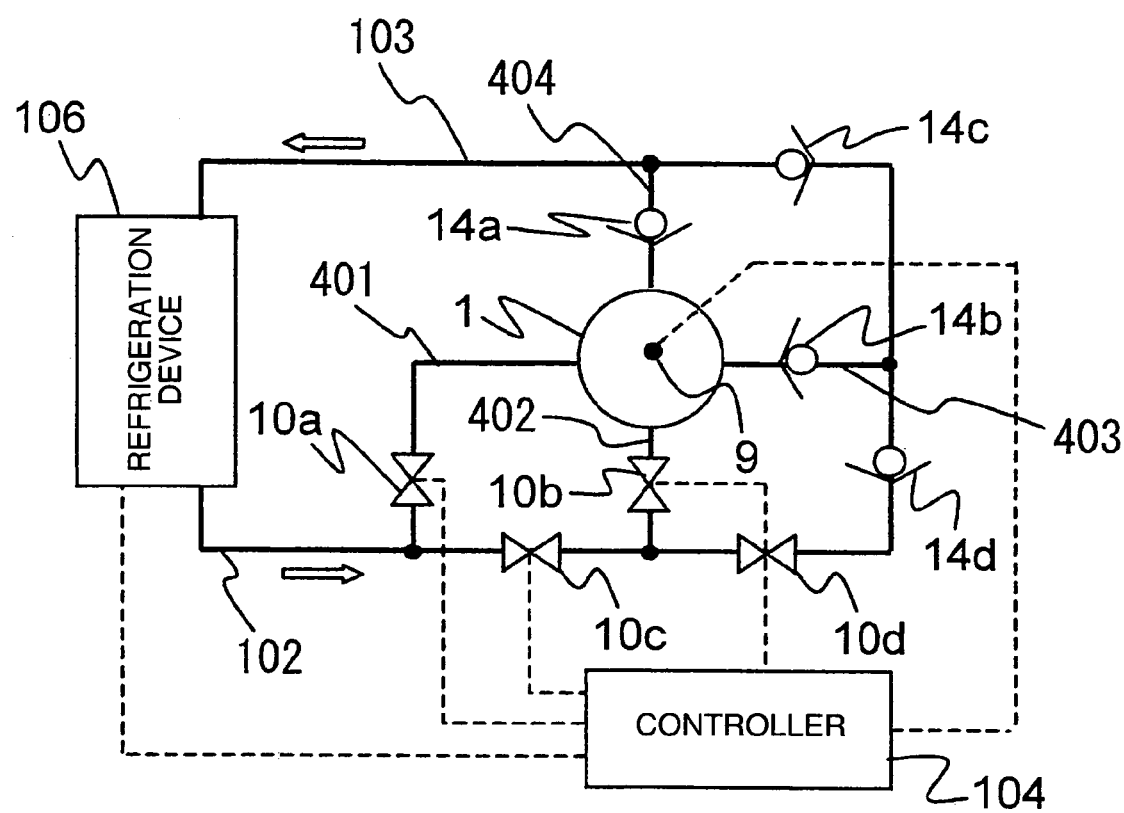
FIG. 4 is a schematic diagram showing an outline construction of a sample table 1 and a refrigeration cycle 101 of the embodiment of FIG. 1.

FIG. 4 shows a configuration when a plurality of coolant paths are arranged in the sample table by using the temperature adjusting unit of FIG. 1. FIG. 4 schematically illustrates an outline construction of the sample table 1 and the refrigeration cycle 101 in the embodiment of FIG. 1. In the following figures, those constitutional elements that have already been explained in the preceding description and have the similar constructions or functions will not be explained even when they are referenced in the drawings.

In FIG. 4, the coolant supplied to the sample table 1 flows through a plurality of paths 401, 402, 403, 404 arranged between the coolant passages 102, 103 and the sample table 1 and its flow is regulated by a combination of flow control valves 10a, 10b, 10c, 10d and check valves 14a, 14b, 14c, 14d arranged in these coolant passages and paths. In this embodiment, the sample table 1 has two independent paths therein in which the coolant flows. Multiple coolant supply lines are formed to supply coolant to these coolant paths 2.

That is, as indicated by arrows of FIG. 4, the coolant supplied from the refrigeration device 106 is fed into the sample table 1 from the two coolant paths 401, 402 that are branched from the coolant passage 102. The coolant then flows through the paths 404, 403 and merges into the coolant passage 103 before returning to the refrigeration device 106 for circulation. The refrigeration device 106 forms the refrigeration cycle 101 that also includes the compressor 5, the condenser 6 and the expansion valve 7. This refrigeration device is disposed as one unit outside the vacuum container, for example, under the floor of the clean room in which the plasma processing apparatus of this invention is disposed, thereby reducing the installation area and improving the maintainability.

In this embodiment, according to the output signals from a plurality of temperature sensors 9 disposed in the sample table 1, the controller 104 issues command signals representing target coolant flow rates in individual paths to flow control valves 10a, 10b to control the operation of these valves to adjust the amount of heat exchanged with the coolant in the paths inside the sample table 1. At this time, by arranging flow control valves 10c, 10d in the coolant paths and controlling their operation, the flow rate of coolant and therefore the temperature of the sample table 1 and the sample 4 can be adjusted more precisely.

The coolant path 2 in the sample table 1 shown in FIG. 4 has two ring paths, one inside the other, almost coaxial with the center axis of the cylindrical sample table 1 between it and the inner wall surface of the process chamber 100 of the vacuum container. In this construction, the inner path and the outer path are supplied coolant of different temperatures and different flow rates to create a temperature distribution in an in-plane direction of the sample mounting surface of the sample table 1 or of the sample 4. Particularly, in a radial direction from the center of the sample table 1 toward the outer circumference, a desired temperature distribution and gradient can be realized, improving the uniformity or accuracy of the processing in the in-plane direction of the sample 4.

Figure 5:
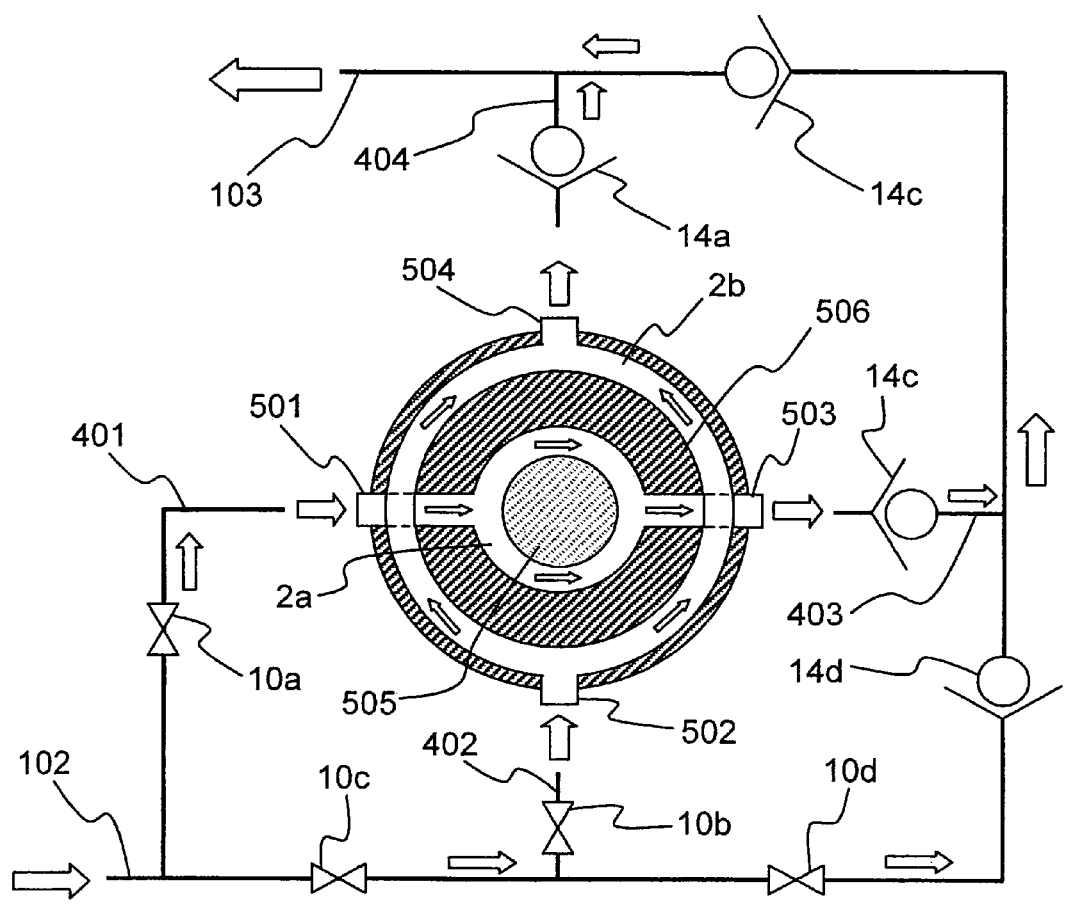
FIG. 5 is a transverse cross-sectional view showing an outline construction of coolant paths in the sample table of FIG. 4.

FIG. 5 shows a construction of the sample table having the two coolant paths described above. FIG. 5 is a transverse cross section showing an outline construction of the coolant paths in the sample table of FIG. 4. As shown in the figure, two ring-shaped paths 2a, 2b are formed in the sample table 1 coaxially with the center of the stand.

The coolant path 2a communicates, at the left and right end of the sample table 1, with a coolant inlet 501 and a coolant outlet 503 situated at symmetrical positions with respect to the center of the sample table 1. The coolant supplied from the coolant path 401 through the coolant inlet 501 into the coolant path 2a branches into side flows around a central portion 505 of the base member of the sample table 1 situated on the center side of the coolant path 2a and then merges. The coolant supplied to the ring-shaped coolant path 2a exchanges heat with the base member of the sample table 1 and evaporates in the ring portion while maintaining a predetermined temperature or pressure. The coolant in a mixed state of gas and liquid phases flows to the coolant outlet 503 on the side opposite the coolant inlet 501 and flows out into the coolant path 403.

Similarly, the coolant path 2b communicates, at the upper and lower end of the sample table 1, with a coolant inlet 502 and a coolant outlet 504 situated at symmetrical positions with respect to the center of the sample table 1. The coolant supplied from the coolant path 402 through the coolant inlet 502 into the coolant path 2b branches into side flows around a ring-shaped partition member 506, that is situated on the center side of the coolant path 2b to separate the coolant path 2b from the inner coolant path 2a, and then merges.

The coolant supplied to the ring-shaped coolant path 2b exchanges heat with the base member of the sample table 1 and evaporates in the ring portion while maintaining a predetermined temperature or pressure. The coolant in a mixed state of gas and liquid phases flows to the coolant outlet 504 on the side opposite the coolant inlet 502 and flows out into the coolant path 404. Although it may be formed of the base member of the sample table 1, the ring-shaped partition member 506 has a provision inside (not shown) that suppresses heat conduction to minimize a heat exchange between the coolants of the paths 2a, 2b or between the base members. For example, the partition member 506 may have slits whose interior is evacuated or filled with gas or material with low heat conduction. Alternatively, the partition member 506 itself may be constructed of a material with low heat conductivity.

Figure 6:
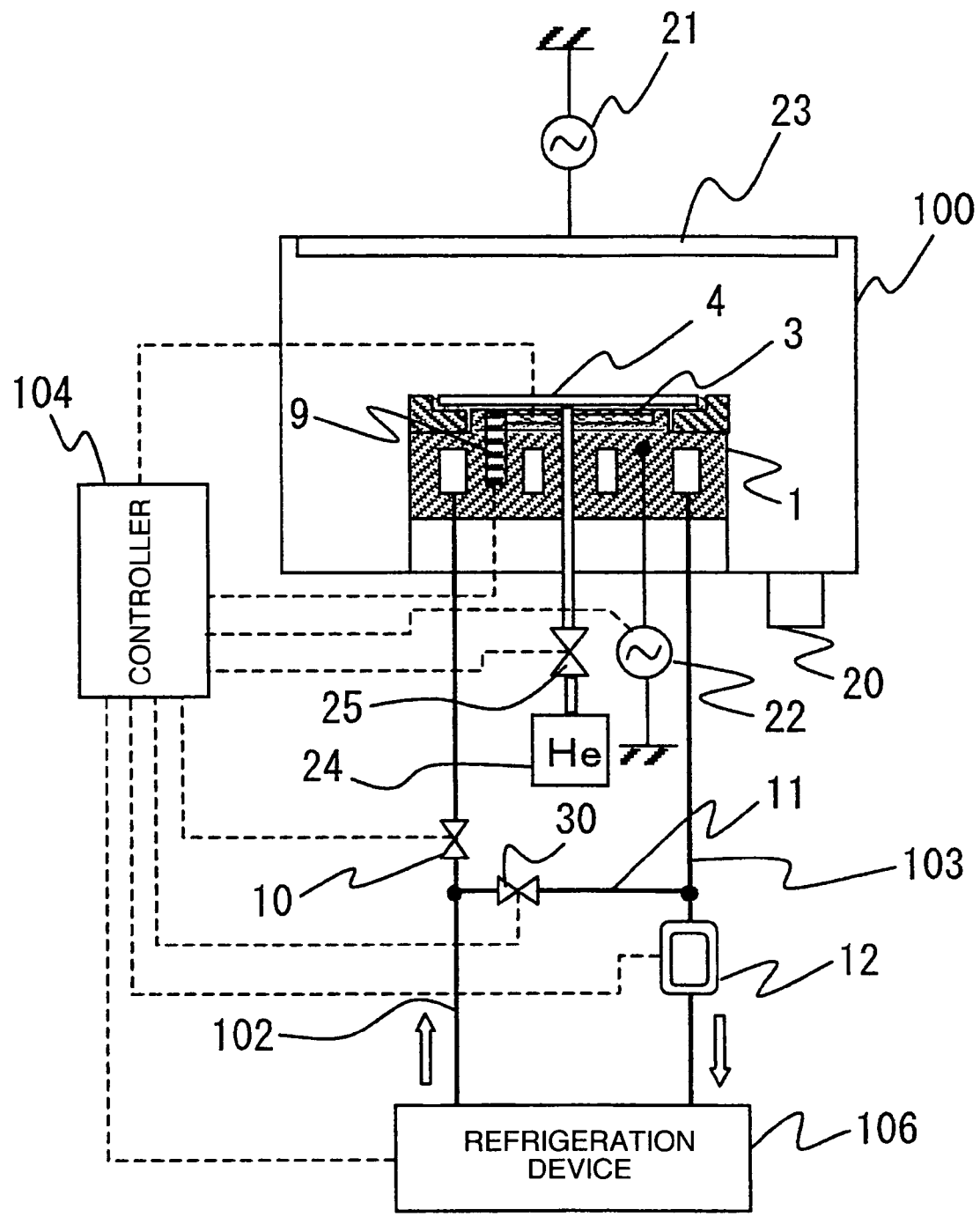
FIG. 6 is a schematic diagram showing an outline construction centering on a process chamber in the plasma processing apparatus of the embodiment of FIG. 1.

FIG. 6 shows an example configuration when the plasma processing apparatus of FIG. 1 is used to perform etching on a thin film formed over the sample 4. FIG. 6 is a schematic diagram showing an outline configuration centering on a process chamber of the plasma processing apparatus according to the embodiment shown in FIG. 1. A sequence of steps performed by the plasma processing apparatus of FIG. 6 is shown in FIG. 7 and FIG. 8. FIG. 7 is a time chart showing a flow of operations performed by the plasma processing apparatus of FIG. 6. FIG. 8 is a graph showing a temperature change of the sample according to the flow of operations shown in FIG. 7.

In this embodiment, the sample 4 is loaded from a sample carrier not shown into the process chamber 100 and placed on the dielectric film 3 on the upper surface of the sample table 1 where it is held by electrostatic chucking. In this state, a process gas for etching the sample 4 is supplied through a gas supply line not shown and poured into the process chamber from a plurality of through-holes arranged in a shower plate not shown that is arranged above the sample table 1 of the process chamber 100 so as to face the sample 4. An evacuation device 20, such as a vacuum pump, arranged below the sample table 1 to communicate with the process chamber 100 is driven to discharge gases and particles out of the process chamber 100 through a space on the outer peripheral side of the sample table 1. The interior of the process chamber 100 is adjusted to a predetermined pressure by the balance between the amount of process gas supplied and the amount of gas discharged by the evacuation device 20.

In a predetermined length of time immediately after the sample 4 has been carried onto the sample table 1 and held on the dielectric film 3 until the plasma is fired to supply heat to the sample 4, the temperature of the sample 4 is detected by the temperature sensor 9 and the controller 104 that has received the output from the temperature sensor 9 issues an operation command based on the output to the refrigeration device 106 or heater 3' for the adjustment of sample temperature. In this temperature adjusting time, the temperature of the sample 4 is set to a predetermined value before the plasma is fired in the process chamber 100. In this embodiment, during the temperature adjusting time, the opening degree of the flow control valve 30 in the coolant bypass 11 is set full open and the vaporizer 12 is also set to its maximum output.

Next, an electric power of UHF or VHF band from an antenna power source 21 is supplied to a disk antenna 23 of conductive material disposed in the process chamber 100 and a bias voltage V1 produced by a high frequency power from a bias power source 22 is supplied to the conductive base member of the sample table 1. Then, a magnetic field generation means not shown on the outer peripheral side of the process chamber 100 generates a plasma (plasma ON) in the process chamber 100, starting the etching of the upper film of the sample 4 (step 1). When a sample is placed on the sample table 1, a heat conductive gas such as He from a heat conductive gas source 24 is supplied through a pipe arranged in the central portion 505 of the base member while it is adjusted in pressure or flow rate by the valve 25, and then poured from openings above the dielectric film 3 into a space between the sample 4 and the dielectric film 3, facilitating heat conduction between the sample table 1 and the sample 4 and improving an efficiency of heat transfer from the sample 4 to the sample table 1.

At this time, the controller 104 issues predetermined command signals to the compressor 5 and expansion valve 7 or heater 3', flow control valves 10, 30 and vaporizer 12 to cause them to operate in a manner that matches the processing condition of step 1, thereby maintaining a desired processing condition. That is, in step 1, the compressor 5 is set to a revolution speed of R1, the expansion valve 7 to an opening degree of A1, the heater 3' to an output of X1, the flow control valve 10 to an opening degree of B1, the flow control valve 30 to an opening degree of C1, and the vaporizer 12 to an output of Y1. These operating conditions are changed according to the command from the controller 104 to keep the temperature T1 of the sample 4 in step 1 at an appropriate value.

When a plurality of film layers stacked one upon the other on the surface of the sample 4 are processed and if the processing condition, such as process gas and power supplies, changes for each layer, the amount of heat transferred to the sample 4 also changes. This embodiment represents a case where the temperature of the sample 4 rises when a lower layer is being processed, i.e., a case where the temperature of the sample 4 representing the processing condition of the lower layer is higher than the temperature of the sample 4 representing the processing condition of the upper layer.

In this embodiment, when the film layer to be processed changes, the controller 104 first changes the revolution speed (pressure) of the compressor 5 and the opening degree of the expansion valve 7 in the refrigeration device 106 to adjust the flow rate and temperature (pressure) of the coolant before detecting the amount of high frequency power to be supplied from the high frequency power source 22 and changing the processing conditions, which include the high frequency power to be supplied to the sample table 1, to match a different processing step (step 2). That is, as shown in FIG. 7, before starting the step 2, command signals are issued to the compressor 5 and the expansion valve 7 so that they have the revolution speed of R2 and the opening degree of A2 that conform to the target processing condition. The coolant that has been adjusted in temperature and flow rate flows out of the refrigeration device 106, passes through the coolant bypass 11 by the operation of the flow control valves 10, 30 and the vaporizer 12 and then returns to the refrigeration device 106 for circulation.

Then, when it detects that the processing on the upper layer is finished and that the layer to be processed has changed, the controller 104 issues command signals to the evacuation device 20, antenna power source 21, high frequency power source 22, process gas supply line and others to make the processing conditions conform to the layer to be newly processed and also issues command signals to the refrigeration device 106 or flow control valves 10, 30 and vaporizer 12 to supply the coolant of the preset flow rate and temperature to the coolant path 2 of the sample table 1 and cause it to circulate through the coolant passages 102, 103. The controller 104 then starts the processing on the lower layer. After this, based on the output from the temperature sensor 9 or variations in the amount of heat transferred to the sample 4, the operation of the flow control valves 10, 30 or the output of the heater 3' is adjusted to maintain the temperature of the sample 4 at a value T2 that conforms to the processing conditions of interest (step 2).

That is, as the operation conditions, the bias voltage is adjusted to V2, the opening degree of the flow control valve 10 to B2, the opening degree of the flow control valve 30 to C2, and the output of the vaporizer 12 to Y2. According to the command signals from the controller 104, these operation conditions are adjusted to maintain the temperature T2 of the sample 4. Then, when the etching is finished, the supply of power, magnetic field and process gas is stopped and the etching process is terminated.

It is noted that the above-described system is effective whatever type the plasma generation means may be, whether it be a type that applies to the electrode arranged opposite the wafer 4 a high frequency power different from the one applied to the wafer 4, an induction coupling type, a magnetic field-high frequency power interaction type, or a type that applies a high frequency power to the electrostatic chucking electrode. Further, this invention can deal with a condition that causes a large amount of heat transfer to the wafer 4 as when a high frequency power of more than 3 W/cm$^2$ is applied to the wafer. It is also effectively applied where a deep hole with a high aspect ratio of 15 or higher is formed. The thin layers to be plasma-processed are contemplated to be single films formed of one main component, such as $SiO_2$, $Si_3N_4$, SiOC, SiOCH and SiC, or multilayered films comprised of two or more different species.

In the refrigeration device 106, the cooling water path 105 for the condenser 6 may use a water channel arranged in the clean room. Further, the pipes used for the coolant passages 102, 103 may use small-diameter (e.g., ¼ or ⅜ inch for a cooling output of 4 kW) metal pipes (e.g., copper pipes), so the coolant passages may be arranged side by side with the process gas supply line. Further, compared with the conventional technology that uses a chiller unit for example, this invention can reduce the size of the apparatus by a volume of the liquid coolant tank. This allows the refrigeration device 106, which has been disposed separate from the process chamber 100, to be unified with it (e.g., by arranging the refrigeration device 106 below and near the process chamber 100), reducing the installation area and therefore the cost of the plasma processing apparatus and shortening the time required by the maintenance service.

The temperature adjusting unit in the plasma processing apparatus proposed by this invention is not limited to the above embodiments and can also be applied to those devices that require quick and highly precise temperature control, such as ashing devices, sputtering devices, ion injection devices, resist application devices and plasma CVD devices.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A plasma processing apparatus to process a plurality of layers stacked one upon the other on a surface of a sample table by using a plasma produced in a process chamber, comprising:
    a vacuum container;
    the sample table disposed in a lower part of a process chamber inside the vacuum container;
    paths arranged in the sample table in which a coolant is supplied and vaporized as it flows;
    a refrigeration cycle having the sample table, a compressor, a condenser and an expansion valve connected in that order and having a passage running from the expansion valve toward the sample table and a passage running from the sample table toward the compressor;
    a bypass to cause the coolant to branch from the passage running toward the sample table, bypass the paths in the sample table and merge with a passage returning to the compressor; and
    a regulator to adjust an amount of coolant passing through the paths in the sample table and circulating in the refrigeration cycle and an amount of coolant branching and flowing through the coolant passages;
    wherein, during the processing of an upper layer of the plurality of layers, the compressor and the expansion valve are operated under a condition conforming to the lower layer to cause the coolant to flow into the bypass and at the same time supply the coolant adjusted by the regulator to the paths in the sample table; and
    wherein a coolant heating means is provided in a coolant passage from the coolant merging point to the compressor.

2. A plasma processing apparatus according to claim 1, wherein the regulator is disposed in the coolant passage between a point where the coolant branches and the sample table or in the coolant passage where the branched coolant has yet to merge.

3. A plasma processing apparatus according to claim 1, wherein, before a temperature of the sample is raised during the processing of the sample, the regulator adjusts an operation of the compressor and the expansion valve beforehand to conform to a condition that matches the changed temperature of the sample;

wherein, when the temperature of the sample is changed, the regulator adjusts the flow rate of the branched coolant and operates the compressor and the expansion valve under the condition adjusted beforehand to supply the coolant to the sample table.

* * * * *